United States Patent [19]

McCloskey

[11] Patent Number: 5,494,755
[45] Date of Patent: Feb. 27, 1996

[54] PASSIVE INTERMODULATION PRODUCTS (PIM) FREE TAPE

[75] Inventor: Thomas E. McCloskey, San Jose, Calif.

[73] Assignee: Lockheed Missiles & Space Co., Inc., Sunnyvale, Calif.

[21] Appl. No.: 257,108

[22] Filed: Jun. 8, 1994

[51] Int. Cl.⁶ .................................................. C09V 7/02
[52] U.S. Cl. ......................... 428/344; 428/354; 428/922
[58] Field of Search ................................... 428/344, 354, 428/922, 194; 361/218

[56] References Cited

U.S. PATENT DOCUMENTS

| | | | |
|---|---|---|---|
| 4,596,897 | 6/1986 | Gruhn | 428/344 X |
| 4,699,830 | 10/1987 | White | 428/922 X |
| 4,727,221 | 2/1988 | Saitou et al. | 428/344 X |
| 4,823,229 | 4/1989 | Waterland, III | 361/218 |
| 4,981,544 | 1/1991 | Nordale | 423/922 X |
| 4,988,550 | 1/1992 | Keyser et al. | 428/354 X |
| 5,111,354 | 5/1992 | Marzi et al. | 361/218 |
| 5,126,985 | 6/1992 | Forrest et al. | 428/344 X |

Primary Examiner—Jenna L. Davis
Attorney, Agent, or Firm—Feix & Feix; H. Donald Volk

[57] ABSTRACT

The present invention relates to a tape for seaming together RF shielding thermal blankets of the kind used for covering the metal components of high power RF transmit and receive communications systems which are susceptible to generating passive intermodulation products, such as the high power transmit antenna boom assemblies of communications spacecraft. The tape is constructed as a composite lay-up of materials which preferably include a plastic film top or outboard layer, a metallized plastic film or metal foil middle layer, and a transfer adhesive bottom layer for securing the middle layer to the outboard layer. The transfer adhesive functions both as a substrate attaching medium and as an electrical isolator for encapsulating the metal surfaces of the middle layer. The tape, when applied to cover a seam between adjacent RF shielding thermal blankets, prevents RF energy from penetrating the seam and contacting any metal-to-metal junctions underneath which could result in the generation of undesirable passive intermodulation products or "PIM".

18 Claims, 3 Drawing Sheets

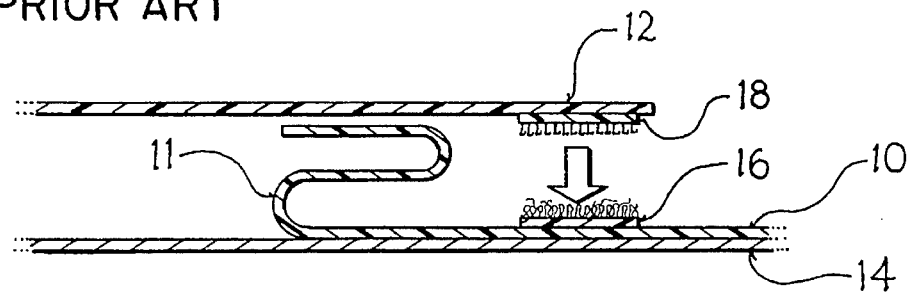
FIG_1 PRIOR ART
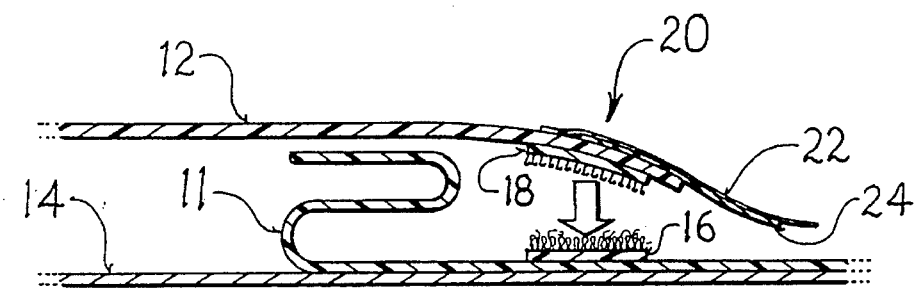
FIG_6
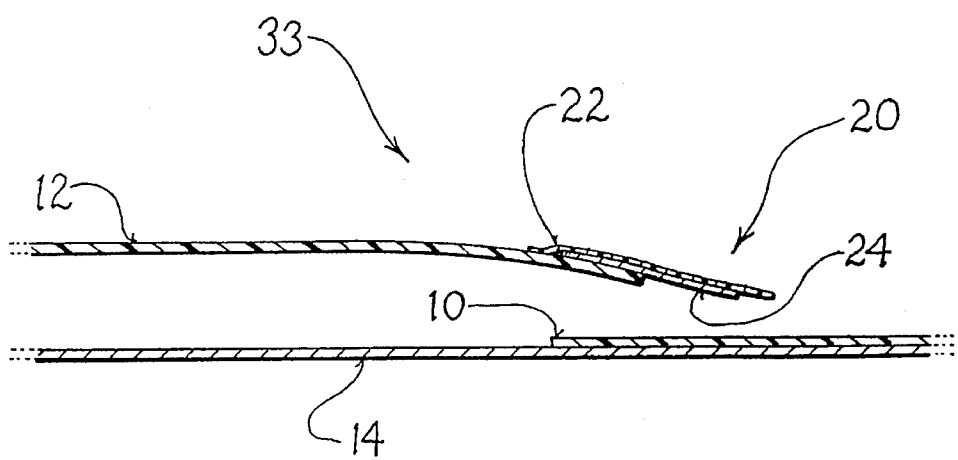
FIG_8

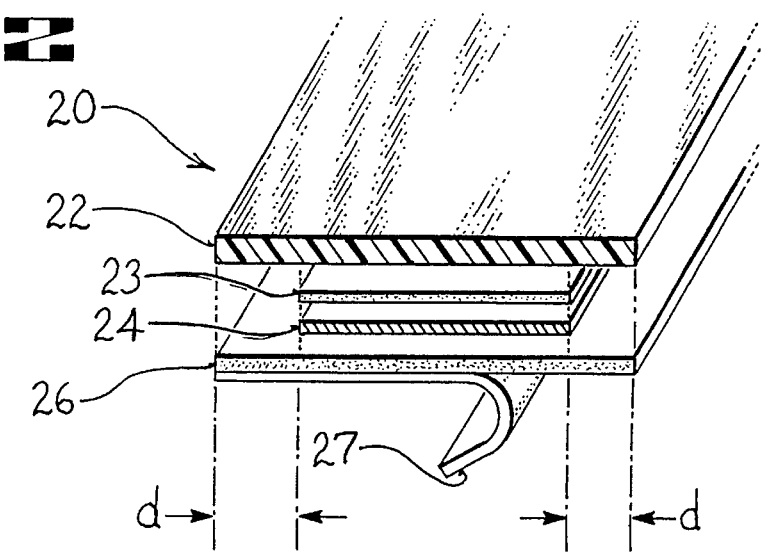
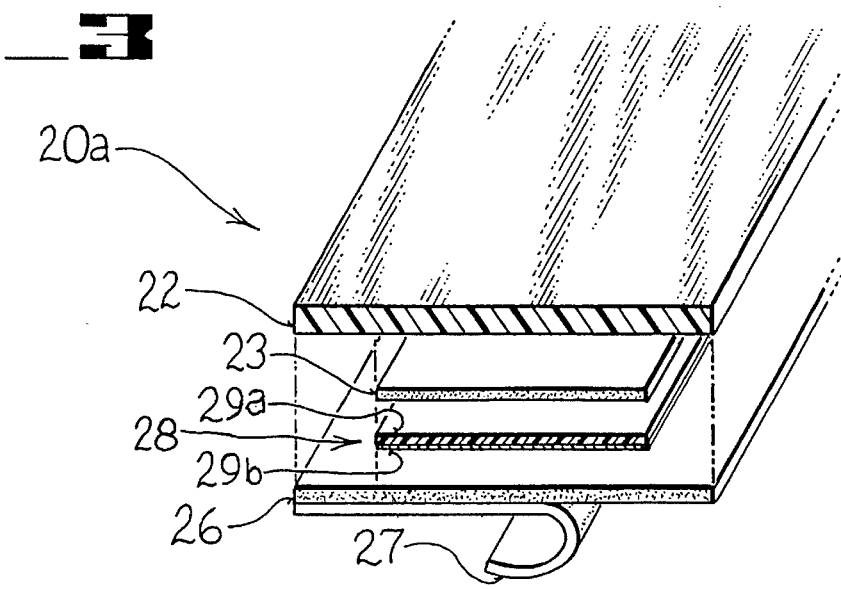
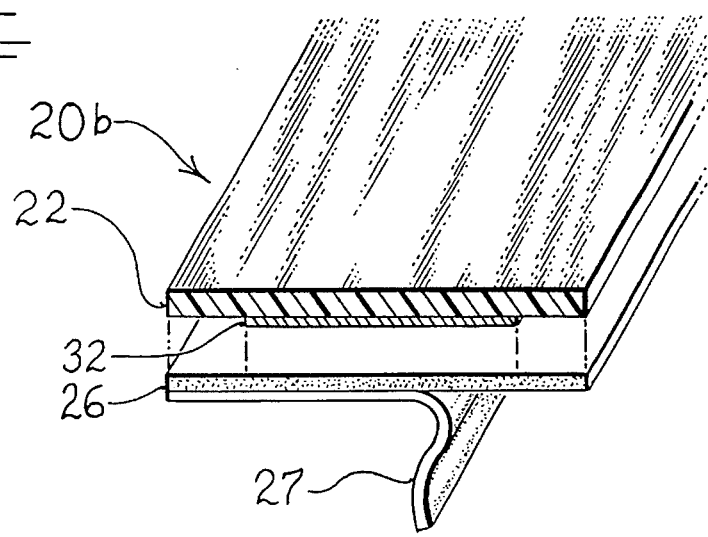

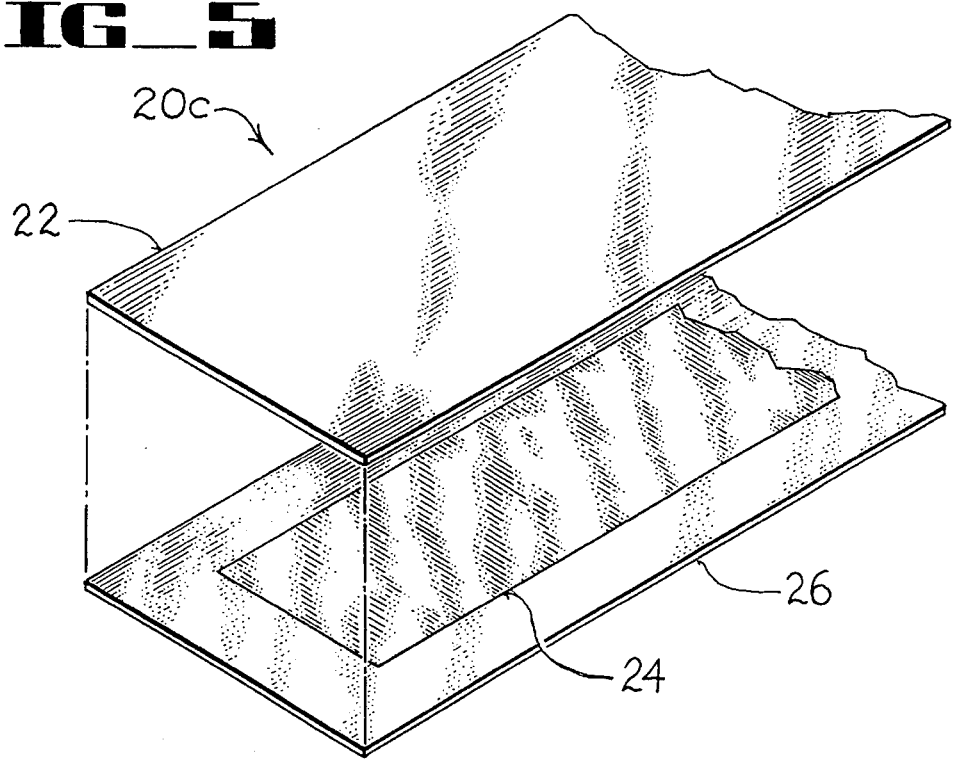
FIG_5
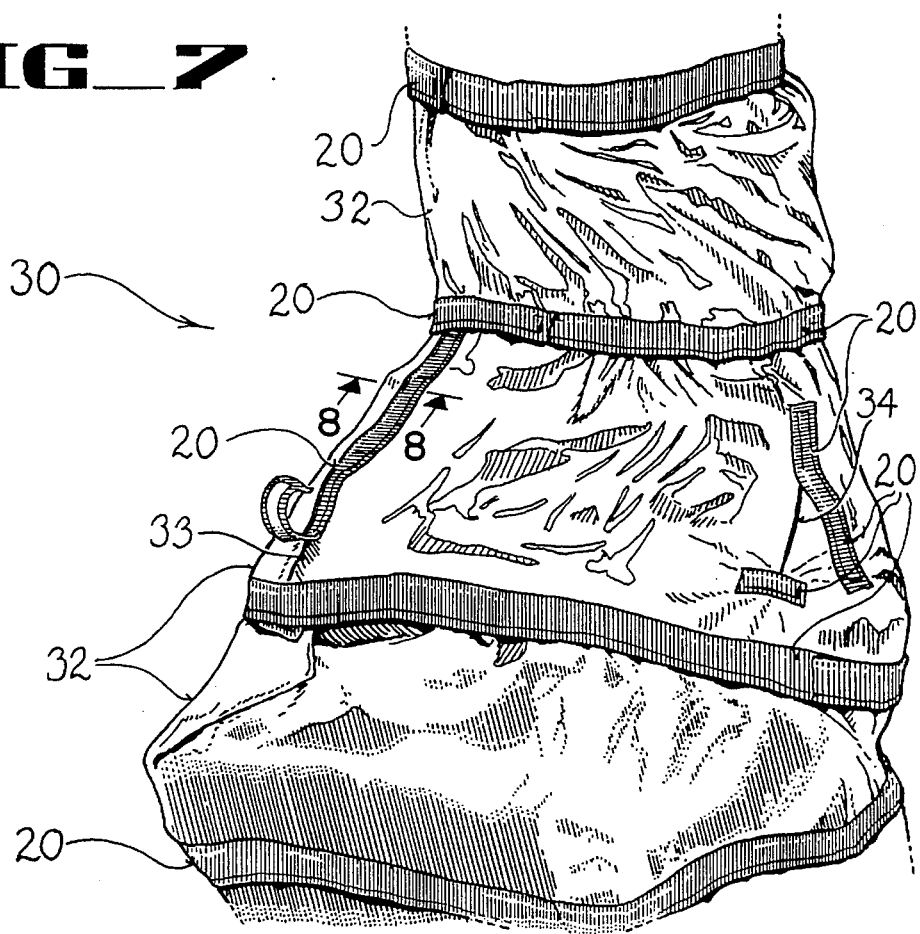
FIG_7

PASSIVE INTERMODULATION PRODUCTS (PIM) FREE TAPE

FIELD OF THE INVENTION

The present invention relates to an adhesive tape which blocks radio frequency (RF) energy. In a particular application, the tape is used for seaming together and for repairing holes or damaged portions of RF shielding thermal blankets of the kind used for covering metal components, such as the transmit antenna boom assemblies, of communications spacecraft. The tape is constructed to prevent RF energy from penetrating the seams, holes or damaged portions of the RF shielding thermal blankets which, in the presence of certain metal-to-metal junctions or shapes, can produce undesirable passive intermodulation products (PIM).

BACKGROUND OF THE INVENTION

A type of interference caused by passive intermodulation products (PIM) occurs in high power radio frequency (RF) communications systems which involve simultaneous transmit and receive operation of RF energy. The problem of PIM generation is particularly acute where the transmit and receive frequencies are closely spaced, which is typically the case for terrestrial and spaced-based communications systems due to the limited availability of frequency spectrum allocated for a specified communication. The loose metal-to-metal contacts which are present within the components of such high power RF communications systems have been identified as sources of PIM.

The generation of intermodulation products in passive metal bodies arises because most metals in air intrinsically possess a thin layer of oxidation which will act as an insulator. When two metal bodies are joined, a metal-insulator-metal interface is produced. Before contact, the insulator acts as a dielectric. As the metal bodies are brought into contact or near contact under pressure, the oxidation layer functions as a semiconductor and sparking will occur. This translates into unwanted signal noise that can be picked up by the receiver resulting in poor system performance.

In the case of a geosynchronous communications satellite, for example, the passive metal-insulator-metal junctions of the transmitter boom assembly have been identified as a source of PIM. It is known in the prior art to use special thermal blankets and/or shields for blocking stray RF energy from contacting the transmitter boom assembly and thereby preventing generation of PIM. These special thermal blankets and/or shields are typically composed of multiple segments or assemblies because the boom assemblies being covered are of irregular geometry and therefore do not lend themselves to an all-in-one encompassing flat pattern wrap or cover.

FIG. 1 illustrates a prior art technique for joining the edges of adjacent RF shielding thermal blankets 10, 12 which cover a metal body 14. In this example, the free edge 11 of the bottom blanket 10 is folded in an S configuration to form a labyrinthine seal with an overlap free edge portion of the top blanket 12. Each blanket 10, 12 is provided with mating hook and loop fasteners 16, 18, respectively, to complete the sealed joint. As is readily apparent, the installation of such an overlap joint can be difficult and time consuming. Also, such joints, especially when located along a bend region, do not always make a perfect seal and therefore present leak paths whereby RF energy may penetrate and contact the metal component underneath and thereby generate PIM.

The present invention provides a novel blanket seaming tape having a construction for preventing RF energy from penetrating the seams between adjoining RF shielding thermal blankets.

SUMMARY OF THE INVENTION

The present invention utilizes a composite lay-up of materials to create an adhesive backed tape which is constructed to provide a barrier to RF energy from penetrating therethrough.

The tape (herein referred to as "PIM Blocking Tape") is used for seaming together RF shielding thermal blankets of the kind used for covering metal components, such as the high power transmit antenna boom assemblies of geosynchronous communications spacecraft. The PIM free tape, when applied to cover a seam between adjacent RF shielding thermal blankets, prevents RF energy from penetrating the seam and contacting any metal-to-metal junctions underneath which could result in the generation of undesirable passive intermodulation products or "PIM".

In one embodiment, the PIM blocking tape is a prefabricated assembly of three layers including a plastic film as the top or outboard layer, a metallized plastic film or metal foil as an RF energy blocking middle layer, and a transfer adhesive as the bottom or inboard (i.e. innermost) layer. In another embodiment, the tape is made up of two layers including a plastic film as the outboard layer and a transfer adhesive as the inboard layer. The plastic film is has a metal coating provided along its inboard surface (i.e. the surface which faces the transfer adhesive) to provide a barrier to RF energy.

A feature common to all embodiments of the PIM blocking tape is that the transfer adhesive functions both as a substrate attaching medium and as an electrical isolator for encapsulating the metal surfaces of the PIM blocking tape to prevent metal-to-metal contact which would occur if the tape were applied directly over a metal body over overwrapped onto itself.

An advantage of the invention is that the PIM blocking tape is made up of readily available materials for simple and low cost manufacture.

Another advantage of the invention is that the PIM blocking tape has many other uses in addition to RF thermal blanket seam sealing. For instance, the PIM blocking tape may be used as a patch for covering ripped or damaged portions of the blankets, or may even be applied as an RF surface shield itself by layering the tape in an overlapping pattern or by making a large formed patch to cover a profile or other large area.

Methods and apparatus which incorporate the features described above and which are effective to function as described above constitute specific objects of this invention.

Other and further objects of the present invention will be apparent from the following description and claims and are illustrated in the accompanying drawings, which by way of illustration, show preferred embodiments of the present invention and the principles thereof and what are now considered to be the best modes contemplated for applying these principles. Other embodiments of the invention embodying the same or equivalent principles may be used and structural changes may be made as desired by those skilled in the art without departing from the present invention and the purview of the appended claims.

BRIEF DESCRIPTION OF THE DRAWING VIEWS

FIG. 1 is a cross section view of a prior art labyrinthine overlap seam for joining two RF shielding thermal blankets.

FIG. 2 is an exploded isometric view illustrating the PIM free blanket seaming tape according to a first embodiment of the present invention.

FIG. 3 is an exploded isometric view illustrating the PIM free blanket seaming tape according to a second embodiment of the present invention.

FIG. 4 is an exploded isometric view illustrating the PIM free blanket seaming tape according to a third embodiment of the present invention.

FIG. 5 is an exploded isometric view illustrating the PIM free blanket seaming tape according to a fourth embodiment of the present invention.

FIG. 6 is a cross section view which illustrates how the PIM free blanket sealing tape of the present invention may be used to enhance the RF barrier capability of a prior art labyrinthine overlap joint between two RF shielding thermal blankets (see e.g. FIG. 1).

FIG. 7 is a perspective view of a section of PIM sensitive spacecraft shown covered by a plurality of RF shielding blanket segments. The blankets are shown seamed together by the PIM free blanket seaming tape of the present invention.

FIG. 8 is a cross section view of the blanket seam region indicated at double arrow 8—8 of FIG. 7.

DETAILED DESCRIPTION OF THE PREFERRED EMBODIMENTS

An RF shielding thermal blanket seaming tape which is free of passive intermodulation products (hereafter referred to simply as "PIM free tape") constructed in accordance with one embodiment of the present invention is indicated generally by the reference numeral 20 in FIG. 2.

The PIM free tape 20 comprises a three layer composite lay-up including a plastic film 22 as the top or outboard layer, a solid metal foil 24 as a RF energy blocking middle layer, and a transfer adhesive 26 as the bottom or inboard layer.

The transfer adhesive 26 functions both as a substrate attaching medium and an electrical isolator for encapsulating the metal foil 24 between the plastic film top layer 22. The transfer adhesive 26 is shown with a non stick protective liner 27 being partly peeled off. Transfer adhesives have been found to be particularly suited for use in the present invention are acrylic and silicone products having a gum-like consistency and a high tenacity for surface adhesion.

Another layer of transfer adhesive 23 or similar double-sided attaching medium may be used to secure the metal foil 24 to the underside or inboard surface of the plastic film top layer 22.

In use, the PIM free tape 20 is applied to seam together and repair damaged portions of RF shielding thermal blankets of the kind used for covering the transmit antenna boom assembly of a geosynchronous communications satellite. The plastic film 22, being the outermost layer, will be exposed to stray RF energy. Accordingly, selection of the appropriate plastic film entails evaluation of the following characteristics: resistance to aging and degradation at high temperatures, conductivity, thickness, flexibility, and surface adhesive compatibility.

Especially suitable plastics for use as the top layer plastic film include polyimides, polyamides, polyesters and polytetrafluoroethylene (PTFE).

A preferred plastic film for use in the invention for space-based applications is a readily available polyimide film marketed by I.E. dupont under the trademark KAPTON. The KAPTON plastic film may be transparent, in which case it acts like a dielectric, or may be carbon-filled for space-based applications. The carbon content should be sufficiently high to prevent an accumulation of static charges along the outboard surface of the tape, yet not so high as to act as a conductor and thereby create a possible source of PIM by itself. A minimum conductance of about $10^9$ Ohms/in$^2$ is sufficient to provide a desired electrostatic discharge capability. A conductance approaching 500 Ohms/in$^2$, however, is undesirable as this level has been demonstrated to propagate PIM.

The metal foil 24 must have a conductivity sufficient to block RF energy emitted from the transmit antenna of the satellite yet not produce PIM. Preferred metals for use as the RF blocking metal layer include the nonferrous metals of titanium, aluminum, gold and silver. Titanium and aluminum are especially preferred as they are readily available in foil form. Interestingly, some other nonferrous metals, such as for example, nickel, are unsuitable as they have been demonstrated to produce PIM.

The strip width of the metal foil layer 24 is preferably less than the strip width of the plastic film top layer 22 and is positioned with respect thereto such that there is a small overlap on the order of about ¼ inch (0.63 cm) on each side of the metal foil layer 22. This overlap is indicated by the length d in FIG. 2. The difference in strip widths between the RF blocking metal foil layer 24 and the plastic film top layer helps to ensure that the edges of the metal foil layer will be adequately covered with the transfer adhesive for complete electrical isolation. Otherwise, the metal portions of the tape may make a loose metal-to-metal contact with a metal body underneath (or even the metal foil layer if the tape is spirally wound wrap about itself) and generate PIM.

FIGS. 3–5 illustrate alternate embodiments of the invention. Elements that are common to all embodiments are indicated by the same reference numerals.

In the PIM free tape 20a of the FIG. 3 embodiment, a metallized plastic film layer 28 is used in place of the metal foil layer 24 of the FIG. 2 embodiment. The metallized plastic film 28 includes a thin film plastic 29a which is coated with a thin film of metal 29b in accordance with known metallization processes. The thin film metal coating 29b may be formed on either one side only (as shown in FIG. 3) or on both sides (not shown) of the plastic film 29a.

Suitable plastics and metals for the metallized plastic film layer 28 include those as listed above. Metallized plastic films, such as aluminized plastic film, are also widely available and are preferred for use in the present invention.

In the PIM free tape 20b of the FIG. 4 embodiment, the inboard surface of the plastic film top layer 22 includes a metallic surface coating 32. Depending on the metal and plastic used, the metallic coating may be applied in accordance with any one of a plurality of known metallization processes, including but not limited to, evaporation or sputtering in high vacuum systems, or chemical vapor deposition (CVD). Again, the nonferrous metals of aluminum, titanium, gold and silver are preferred.

The PIM free tape 20 shown in FIG. 5 is essentially the same as the embodiment of FIG. 2, except that the adhesive layer between the metal foil layer 24 and the plastic film top layer 22 is omitted.

FIG. 6 illustrates how the PIM free tape 20 of the present invention may be used in combination with the VELCRO brand hook and loop fastener and labyrinthine seal arrangement of the prior art to provide a better seal against penetration of RF energy. The transfer adhesive layer 23 is omitted for clarity.

FIG. 7 shows a section of spacecraft 30 which is PIM sensitive, such as for example the transmit antenna boom assembly of a communications satellite. The section of spacecraft 30 is of irregular shape and is shown covered with several RF shielding thermal blankets 32 having seams 33 secured by the PIM free tape 20 and damaged portions such as rips, or tears 34 in the blanket material that are repaired by patches made from the PIM free tape 20.

FIG. 8 is an enlarged cross section view of a blanket seam 33 between two RF shielding thermal blankets 10 and 12 which cover a section or metal body portion 14 of the spacecraft. This figure illustrates how the PIM free tape 20 is applied to seal a blanket seam. Again the transfer adhesive 23 is omitted for purposes of clarity.

While I have illustrated and described the preferred embodiments of my invention, it is to be understood that these are capable of variation and modification, and I therefore do not wish to be limited to the precise details set forth, but desire to avail myself of such changes and alterations as fall within the purview of the following claims.

I claim:

1. An electrically non-conductive and RF shielding tape for seaming together and for repairing holes or damaged portions of RF shielding thermal blankets of the kind used for covering metal components of communications spacecraft, said tape having a construction for preventing RF energy from penetrating the seams, holes or damaged portions of the RF shielding thermal blankets which, in the presence of certain metal-to-metal junctions or shapes, can produce undesirable passive intermodulation products (PIM), said tape comprising:
   a) a metallic barrier strip which provides a barrier to RF energy;
      said metallic barrier strip comprising a strip of metal foil having an outboard surface, an inboard surface and opposed side edges spaced a distance apart to define a strip width;
   b) PIM shielding structure which encapsulates the outboard surface, the inboard surface and the opposed side edges of the strip of metal foil for electrically isolating and insulating the metal surfaces of the strip of metal foil to prevent the formation of PIM producing metal-to-metal junctions as the tape structure is applied to metal bodies or wound onto itself;
   said PIM shielding structure comprising,
      i) a strip of plastic material forming an outer layer of the tape, said strip of plastic material having an outboard surface, an inboard surface and opposed side edges spaced a distance apart to define a strip width, said strip width of said strip of plastic material being wider than said strip width of said strip of metal foil and providing side margins extending outwardly beyond the side edges of the metallic barrier strip,
      ii. an adhesive adhering said outboard surface of said strip of metal foil to said inboard surface of said strip of said plastic material such that said side edges of said strip of metal foil are located inwardly of said side edges of said strip of plastic material thereby leaving a pair of exposed side margins along said inboard surface of said plastic material; and
      iii. a layer of adhesive gum material forming a bottom layer of the tape and disposed covering and adhered to both said inboard surface of said strip of metal foil and said exposed side margins of said inboard surface of said plastic material.

2. The tape according to claim 1 wherein said metal foil is a non ferrous metal foil selected from the group consisting of titanium, aluminum, gold and silver.

3. The tape according to claim 2 wherein said strip of plastic material comprises a plastic film selected from the group consisting of:
   a) polyester film;
   b) polyimide film;
   c) polytetraflouroethylene film; and
   d) polyamide film.

4. The tape according to claim 3 wherein said plastic film is impregnated with a carbon content having a conductivity sufficiently low so as not to produce PIM yet sufficiently high to prevent accumulation of static electric charges along the outboard surfaces of the tape.

5. The tape according to claim 1 wherein:
   a) said metallic barrier means comprises a strip of metallized plastic film having an outboard surface, an inboard surface and opposed side edges spaced a distance apart to define a strip width;
   b) said PIM shielding means comprises:
      i) a strip of plastic material forming an outer layer of the tape, said strip of plastic material having an outboard surface, an inboard surface and opposed side edges spaced a distance apart to define a strip width, said strip width of said strip of plastic material is wider than said strip width of said strip of metalized plastic film;
      ii) means for adhering said outboard surface of said strip of metalized plastic film to said inboard surface of said strip of plastic material such that said side edges of strip of metalized plastic film are located inwardly of said side edges of said strip of plastic material thereby leaving a pair of exposed side margins along said inboard surface of said plastic material; and
      iii) a layer of adhesive gum material forming a bottom layer of the tape and disposed covering both said inboard surface of said strip of metalized plastic film and said exposed side margins of said inboard surface of said plastic material.

6. The tape according to claim 5 wherein one of said inboard and outboard surfaces of said metalized plastic film is provided with a metal coating.

7. The tape according to claim 6 wherein said strip of plastic material comprises a plastic film selected from the group consisting of:
   a) polyester film;
   b) polyimide film;
   c) polytetraflouroethylene film; and
   d) polyamide film.

8. The tape according to claim 6 wherein said plastic film is impregnated with carbon and has a conductivity sufficiently low so as not to produce PLM yet sufficiently high to prevent accumulation of static electric charges.

9. The tape according to claim 5 wherein both of said inboard and outboard surfaces of said metalized plastic film is provided with a metal coating.

10. The tape according to claim 9 wherein said strip of plastic material comprises a plastic film selected from the group consisting of:

a) polyester film;

b) polyimide film;

c) polytetraflouroethylene film; and d) polyamide film.

11. The tape according to claim 10 wherein said plastic film is impregnated with carbon and has a conductivity sufficiently low so as not to produce PIM yet sufficiently high to prevent accumulation of static electric charges.

12. The tape according to claim 1 wherein:

a) said PIM shielding means comprises:
   i) a strip of plastic material forming an outer layer of the tape, said strip of plastic material having an outboard surface, an inboard surface and opposed side edges spaced a distance apart to define a strip width;
   ii) a layer of adhesive gum material forming a bottom layer of the tape;

b) said metallic barrier means comprises a metal coating strip disposed along said inboard surface of said strip of plastic material, said metal coating strip having a strip width less than said strip width of strip of said plastic material; and c) said layer of adhesive gum material is disposed covering said inboard surface of said plastic material including said metal coating strip.

13. The tape according to claim 12 wherein said metal coating strip is applied to said inboard surface of said plastic material by a vapor deposition process.

14. The tape according to claim 13 wherein said strip of plastic material comprises a plastic film selected from the group consisting of:

a) polyester film;

b) polyimide film;

c) polytetraflouroethylene film; and d) polyamide film.

15. The tape according to claim 14 wherein said plastic film is impregnated with carbon and has a conductivity sufficiently low so as not to produce PIM yet sufficiently high to prevent accumulation of static electric charges.

16. The tape according to claim 12 wherein said metal coating strip is applied to said inboard surface of said plastic material by a sputter coming process.

17. The tape according to claim 16 wherein said strip of plastic material comprises a plastic film selected from the group consisting of:

a) polyester film;

b) polyimide film;

c) polytetraflouroethylene film; and d) polyamide film.

18. The tape according to claim 17 wherein said plastic film is impregnated with carbon and has a conductivity sufficiently low so as not to produce PIM yet sufficiently high to prevent accumulation of static electric charges.

* * * * *